(12) United States Patent
Tung

(10) Patent No.: US 11,895,358 B2
(45) Date of Patent: Feb. 6, 2024

(54) IMAGE SIGNAL TRANSMISSION APPARATUS AND SIGNAL OUTPUT CIRCUIT HAVING DC GAIN MAINTAINING MECHANISM THEREOF

(71) Applicant: REALTEK SEMICONDUCTOR CORPORATION, Hsinchu (TW)

(72) Inventor: Ming-Hui Tung, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 59 days.

(21) Appl. No.: 17/585,600

(22) Filed: Jan. 27, 2022

(65) Prior Publication Data

US 2022/0272410 A1 Aug. 25, 2022

(30) Foreign Application Priority Data

Feb. 24, 2021 (TW) ................................ 110106500

(51) Int. Cl.
*H04N 21/4363* (2011.01)
(52) U.S. Cl.
CPC ............................. *H04N 21/43635* (2013.01)
(58) Field of Classification Search
None
See application file for complete search history.

(56) References Cited

U.S. PATENT DOCUMENTS 9,397,623 B1 7/2016 Lacroix
2020/0119956 A1* 4/2020 Sun ........................ H04B 3/18

OTHER PUBLICATIONS

OA letter of the counterpart TW application (appl. no. 110106500) dated Jun. 30, 2021. Summary of the OA letter: 1. Claims 1-2, 9 are rejected as being anticipated by the disclosure of the cited reference 1 (U.S. Pat. No. 9,397,623 B1). 2. Claims 3 is rejected as being unpatentable over the disclosure of the cited reference 1. 3. Claims 4~8 and 10 are allowable. Correspondence bewteen claims of TW counterpart application and claims of US application:1. Claims 1~10 in TW counterpart application correspond to claims 1~9 and 16 in US application,respectively.

* cited by examiner

*Primary Examiner* — Samira Monshi
(74) *Attorney, Agent, or Firm* — WPAT, P.C.

(57) ABSTRACT

The present invention discloses a signal output circuit having DC gain maintaining mechanism used in an image signal transmission apparatus that includes a front-stage driving circuit and a back-stage driving circuit. The front-stage driving circuit includes a continuous time linear equalizer (CTLE) having an adjusting capacitor and configured to receive a digital input signal to perform a high frequency enhancement thereon to increase a bandwidth of the digital input signal to generate a front-stage output signal. The back-stage driving circuit includes a CTLE without the adjusting capacitor and configured to increase a DC gain of the front-stage output signal to compensate a DC gain drop between the front-stage output signal and the digital input signal to generate a back-stage output signal to an image signal receiving apparatus.

14 Claims, 3 Drawing Sheets

IMAGE SIGNAL TRANSMISSION APPARATUS AND SIGNAL OUTPUT CIRCUIT HAVING DC GAIN MAINTAINING MECHANISM THEREOF

BACKGROUND OF THE INVENTION

1. Field of the Invention

The present invention relates to an image signal transmission apparatus and a signal output circuit having DC gain maintaining mechanism thereof.

2. Description of Related Art

High definition multimedia interface (HDMI) is a video and audio transmission interface that performs transmission in fully digital form, and is capable of transmitting uncompressed audio signal and video signal. Since both the audio signal and the video signal can be transmitted by using the same wire, HDMI transmission technology simplifies the installation of the system wires.

In a system that uses such a transmission technology, a source terminal transmitting the video and audio signals and a sink terminal receiving the video and audio signals are included. A signal output circuit is required to be disposed in the source terminal to modify the video and audio signals such that the sink terminal receives the video and audio signals with high quality. However, the signal output circuit often increases the alternating current (AC) gain at the sacrifice of direct current (DC) gain.

SUMMARY OF THE INVENTION

In consideration of the problem of the prior art, an object of the present invention is to supply an image signal transmission apparatus and a signal output circuit having DC gain maintaining mechanism thereof.

The present invention discloses a signal output circuit having DC gain maintaining mechanism used in an image signal transmission apparatus (TX) that includes a front-stage driving circuit and a back-stage driving circuit. The front-stage driving circuit includes a first continuous time linear equalizer (CTLE) having an adjusting capacitor and configured to receive a digital input signal to perform a high frequency enhancement thereon to increase a bandwidth of the digital input signal to generate a front-stage output signal. The back-stage driving circuit includes a second CTLE without the adjusting capacitor and configured to increase a DC gain of the front-stage output signal to compensate a DC gain drop between the front-stage output signal and the digital input signal to generate a back-stage output signal to an image signal receiving apparatus (RX).

The present invention also discloses an image signal transmission apparatus used in an image signal transmission system that includes a digital signal processing circuit and a signal output circuit. The digital signal processing is configured to generate a digital input signal. The signal output circuit includes a front-stage driving circuit and a back-stage driving circuit. The front-stage driving circuit includes a first CTLE having an adjusting capacitor and configured to receive the digital input signal to perform a high frequency enhancement thereon to increase a bandwidth of the digital input signal to generate a front-stage output signal. The back-stage driving circuit includes a second CTLE without the adjusting capacitor and configured to increase a DC gain of the front-stage output signal to compensate a DC gain drop between the front-stage output signal and the digital input signal to generate a back-stage output signal to an image signal receiving apparatus (RX).

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

An aspect of the present invention is to provide an image signal transmission apparatus and a signal output circuit having DC gain maintaining mechanism thereof to increase the DC gain by disposing a back-stage driving circuit to compensate a DC gain drop in a front-stage driving circuit, such that a bandwidth of an output signal can be increased without sacrificing the DC gain.

Figure 1:
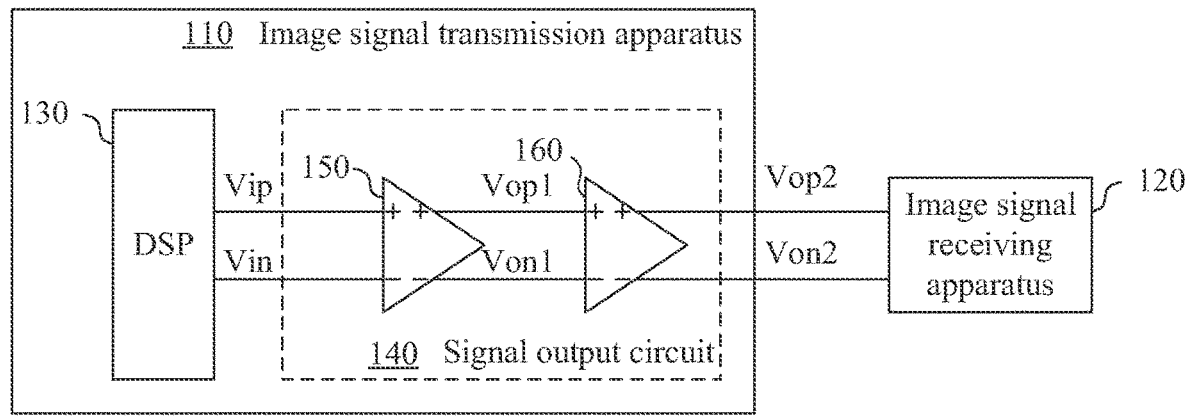
FIG. 1 illustrates a block diagram of an image signal transmission system according to an embodiment of the present invention.

Reference is now made to FIG. 1. FIG. 1 illustrates a block diagram of an image signal transmission system 100 according to an embodiment of the present invention. The image signal transmission system 100 includes an image signal transmission apparatus (TX) 110 and an image signal receiving apparatus (RX) 120.

In an embodiment, the image signal transmission system 100 is a system that transmits signals of image and sound (video/audio signal) according to high definition multimedia interface (HDMI) technology. The image signal transmission apparatus 110 servers as a source terminal, e.g., a set-up box, a DVD player or a computer. The image signal receiving apparatus 120 serves as a sink terminal, e.g., a television, a projector or other display devices.

The image signal transmission apparatus 110 is configured to perform processing on the video/audio signal and transmit the video/audio signal to the image signal receiving apparatus 120 to be playback.

The image signal transmission apparatus 110 includes a digital signal processing circuit 130 (abbreviated as DSP in FIG. 1) and a signal output circuit 140.

The digital signal processing circuit 130 is configured to generate a digital input signal in a differential form, which actually includes digital input signals Vip and Vin. The signal output circuit 140 has a DC gain maintaining mechanism to enhance and output the digital input signals Vip and Vin. The signal output circuit 140 includes a front-stage driving circuit 150 and a back-stage driving circuit 160.

The front-stage driving circuit 150 is configured to receive the digital input signals Vip and Vin to perform high frequency enhancement to increase the bandwidth of the digital input signals Vip and Vin and further generate a front-stage output signal which is also in differential form and actually includes front-stage output signals Vop1 and Von1.

Figure 2:
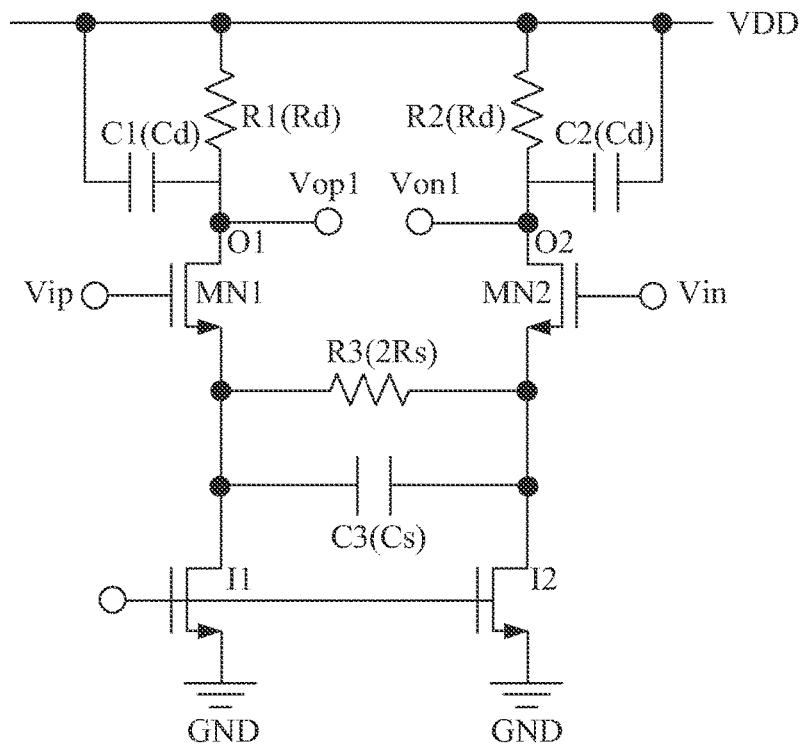
FIG. 2 illustrates a circuit diagram of the front-stage driving circuit according to an embodiment of the present invention.

Reference is now made to FIG. 2. FIG. 2 illustrates a circuit diagram of the front-stage driving circuit 150 according to an embodiment of the present invention. In an embodiment, the front-stage driving circuit 150 includes a first continuous time linear equalizer (CTLE) having an adjusting capacitor. More specifically, the CTLE includes two input transistors MN1 and MN2, two load resistors R1 and R2, two load capacitors C1 and C2, an adjusting resistor R3, an adjusting capacitor C3 and two current sources I1 and I2.

Each of the input transistors MN1 and MN2 includes a gate, a drain and a source. The gate of the input transistor MN1 is configured to receive the digital input signal Vip. The gate of the input transistor MN2 is configured to receive the digital input signal Vin. The drain of the input transistors MN1 is electrically coupled to an output terminal O1. The drain of the input transistors MN2 is electrically coupled to an output terminal O2.

The drain of the input transistors MN1 is configured to generate the front-stage output signal Vop1 to the output terminal O1. The drain of the input transistors MN2 is configured to generate the front-stage output signal Von1 to the output terminal O2.

The load resistors R1 is electrically coupled between the drain of the input transistors MN1 and an operation voltage source VDD. The load resistors R2 is electrically coupled between the drain of the input transistors MN2 and the operation voltage source VDD. The load capacitors C1 is electrically coupled between the drain of the input transistors MN1 and the operation voltage source VDD. The load capacitors C2 is electrically coupled between the drain of the input transistors MN2 and the operation voltage source VDD.

The adjusting resistor R3 and the adjusting capacitor C3 are electrically coupled in parallel between the sources of the input transistors MN1 and MN2. The current source I1 is electrically coupled between the source of the input transistors MN1 and a ground terminal GND. The current source I2 is electrically coupled between the source of the input transistors MN2 and the ground terminal GND.

In an embodiment, a zero and two poles of a frequency response of the front-stage driving circuit 150 are determined by a plurality of circuit parameters of the front-stage driving circuit 150.

Figure 3:
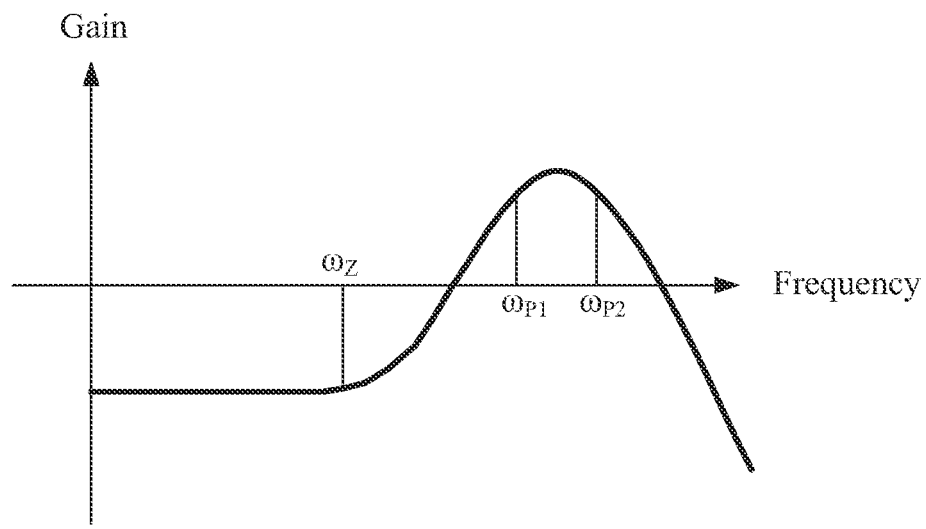
FIG. 3 illustrates a diagram of a frequency response of the front-stage driving circuit according to an embodiment of the present invention.

Reference is now made to FIG. 3 at the same time. FIG. 3 illustrates a diagram of a frequency response of the front-stage driving circuit 150 according to an embodiment of the present invention. The X-axis corresponds to the frequency and the Y-axis corresponds to the gain. In the present embodiment, the gain that the Y-axis corresponds to is the original gain of the digital input signals Vip and Vin.

In an embodiment, the circuit parameters of the front-stage driving circuit 150 include a transconductance of the transistors, resistances of the resistors and capacitances of the capacitors. For example, the transconductance of the input transistors MN1 and MN2 is gm. The resistance of each of the load resistors R1 and R2 is Rd. The capacitance of each of the load capacitors C1 and C2 is Cd. The resistance of the adjusting resistor R3 is 2Rs. The capacitance of the adjusting capacitor C3 is Cs.

As a result, for the frequency response of the front-stage driving circuit 150, a transfer function H(s) between the digital input signals Vip and Vin and the front-stage output signals Vop1 and Von1 is expressed as:

$H(s) = (gmRd)(1+sRsCs)/(1+sRcCs+gmRs)(1+sRdCd))$

Further, the DC gain of the front-stage driving circuit 150 is expressed as:

$(gmRd)/(1+(gmR))$

The zero $\omega_Z$ at the frequency response is expressed as:

$\omega_Z = 1/(RsCs)$

One of the two poles $\omega_{P1}$ is expressed as:

$\omega_{P1} = (1+gmRs)/(RsCs)$

The other one of the two poles $\omega_{P2}$ is expressed as:

$\omega_{P2} = 1/(RdCd)$

As a result, by adjusting the circuit parameters, the zero and the two poles of the frequency response of the front-stage driving circuit 150 can be adjusted accordingly such that the DC gain and the high frequency part of the signal can be increased with different degrees.

It is appreciated that after the processing the front-stage driving circuit 150, the DC gain between the front-stage output signals Vop1 and Von1 and the digital input signals Vip and Vin drops.

The back-stage driving circuit 160 is configured to receive the front-stage output signals Vop1 and Von1 to increase the DC gain of the front-stage output signals Vop1 and Von1, to compensate a DC gain drop between the front-stage output signals Vop1 and Von1 and the digital input signals Vip and Vin to generate a back-stage output signal to the image signal receiving apparatus 120, in which the back-stage output signal is also differential and actually includes back-stage output signals Vop2 and Von2.

Figure 4:
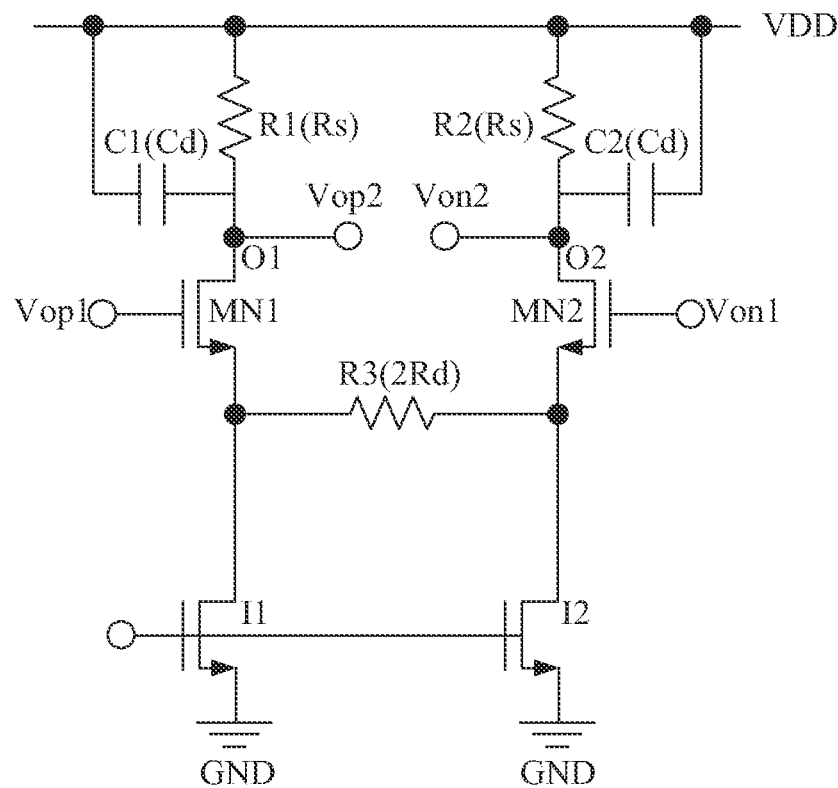
FIG. 4 illustrates a circuit diagram of the back-stage driving circuit according to an embodiment of the present invention.

Reference is now made to FIG. 4. FIG. 4 illustrates a circuit diagram of the back-stage driving circuit 160 according to an embodiment of the present invention. In an embodiment, the back-stage driving circuit 160 includes a second CTLE without the adjusting capacitor. More specifically, the CTLE includes two input transistors MN1 and MN2, two load resistors R1 and R2, two load capacitors C1 and C2, an adjusting resistor R3 and two current sources I1 and I2. It is appreciated that the configuration of the back-stage driving circuit 160 is similar to the configuration of the front-stage driving circuit 150. As a result, for the corresponding components, no new label is used.

Besides not having the adjusting capacitor, the connection and operation of the components in the back-stage driving circuit 160 are identical to the front-stage driving circuit 150. The identical parts are therefore not described herein. In the present embodiment, for the back-stage driving circuit 160, the gate of the input transistors MN1 is configured to receive the front-stage output signal Vop1. The gate of the input transistors MN2 is configured to receive the front-stage output signal Von1. The drain of the input transistors MN1 is configured to generate the back-stage output signal Vop2 to the output terminal O1. The drain of the input transistors MN2 is configured to generate the back-stage output signal Von2 to the output terminal O2.

In an embodiment, a frequency response of the back-stage driving circuit 160 only includes a single pole. The pole is determined by a plurality of circuit parameters of the back-stage driving circuit 160.

Figure 5:
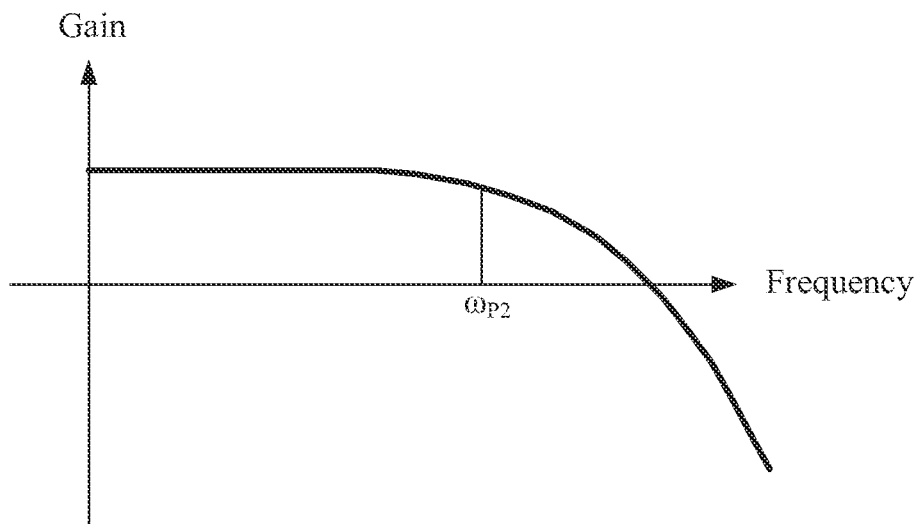
FIG. 5 illustrates a diagram of a frequency response of the back-stage driving circuit according to an embodiment of the present invention.

Reference is now made to FIG. 5 at the same time. FIG. 5 illustrates a diagram of a frequency response of the back-stage driving circuit 160 according to an embodiment of the present invention. The X-axis corresponds to the frequency and the Y-axis corresponds to the gain. In the present embodiment, the gain that the Y-axis corresponds to is the original gain of the front-stage output signals Vop1 and Von1. Similar to the front-stage driving circuit 150, the circuit parameters of the back-stage driving circuit 160 include a transconductance of the transistors, resistances of the resistors and capacitances of the capacitors. However, the circuit parameters are different from the circuit parameters of the front-stage driving circuit 150. More specifically, the transconductance of the input transistors MN1 and MN2 is gm. The resistance of each of the load resistors R1 and R2 is Rs. The capacitance of each of the load capacitors C1 and C2 is Cd. The resistance of the adjusting resistor R3 is 2Rd.

As a result, for the frequency response of the back-stage driving circuit 160, a transfer function H(s) between the front-stage output signals Vop1 and Von1 and the back-stage output signals Vop2 and Von2 is expressed as:

$$H(s)=(gmRs)/(1+gmRd)(1+sRsCd)$$

Further, the DC gain of the back-stage driving circuit 160 is expressed as:

$$(gmRs)/(1+(gmRd))$$

The single pole $\omega_{P2}$ is expressed as:

$$\omega_{P2}=1/(RsCd)$$

It is appreciated that after the processing of the back-stage driving circuit 160, the DC gain between the back-stage output signals Vop2 and Von2 and the front-stage output signals Vop1 and Von1 increases.

Figure 6:
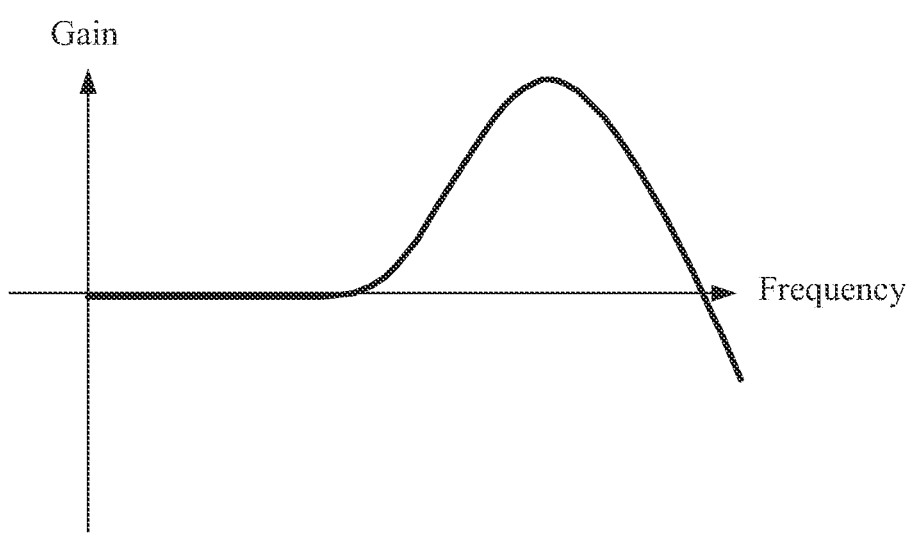
FIG. 6 illustrates a diagram of a frequency response between the digital input signal and the back-stage output signals generated through the process of the front-stage driving circuit and the back-stage driving circuit according to an embodiment of the present invention.

Reference is now made to FIG. 6. FIG. 6 illustrates a diagram of a frequency response between the digital input signal Vip and Vin and the back-stage output signals Vop2 and Von2 generated through the process of the front-stage driving circuit 150 and the back-stage driving circuit 160 according to an embodiment of the present invention. More specifically, the waveform in FIG. 6 is equivalent to an addition result of the waveforms in FIG. 3 and FIG. 5.

Since the DC gain of the front-stage driving circuit 150 is (gmRd)/(1+(gmRs)) and the DC gain of the back-stage driving circuit 160 is (gmRs)/(1+(gmRd)), the DC gain between the back-stage output signals Vop2 and Von2 and the digital input signals Vip and Vin is expressed as:

$$((gmRd)(gmRs))/((1+(gmRs))(1+(gmRd)))$$

In an embodiment, the DC gain of each of the front-stage driving circuit 150 and the back-stage driving circuit 160 cancels out each other when a multiplication result of a transconductance and a resistance of a load resistor of each of the front-stage driving circuit 150 and the back-stage driving circuit 160 (i.e., gmRd and gmRs) is far larger than 1. More specifically, under such a condition, the DC gain between the back-stage output signals Vop2 and Von2 and the digital input signals Vip and Vin is 1.

In conventional design, after the signal is processed in the front-stage driving circuit of the signal output circuit can increase the AC gain and the bandwidth, the DC gain drops accordingly. As a result, the signal output circuit of the present invention is able to increase the DC gain by dispos-ing a back-stage driving circuit to compensate the DC gain drop in the front-stage driving circuit, such that the bandwidth of the output signal can be increased without sacrificing the DC gain.

It is appreciated that the embodiments described above are merely an example. In other embodiments, it should be appreciated that many modifications and changes may be made by those of ordinary skill in the art without departing from the spirit of the disclosure.

In summary, the image signal transmission apparatus and the signal output circuit having DC gain maintaining mechanism thereof of the present invention increases the DC gain by disposing a back-stage driving circuit to compensate the DC gain drop in the front-stage driving circuit, such that the bandwidth of the output signal can be increased without sacrificing the DC gain.

The aforementioned descriptions represent merely the preferred embodiments of the present invention, without any intention to limit the scope of the present invention thereto. Various equivalent changes, alterations, or modifications based on the claims of present invention are all consequently viewed as being embraced by the scope of the present invention.

What is claimed is:

1. A signal output circuit having DC gain maintaining mechanism used in an image signal transmission apparatus (TX), comprising:
   a front-stage driving circuit comprising a first continuous time linear equalizer (CTLE) having an adjusting capacitor and configured to receive a digital input signal to perform a high frequency enhancement thereon to increase a bandwidth of the digital input signal to generate a front-stage output signal; and
   a back-stage driving circuit comprising a second CTLE without the adjusting capacitor and configured to increase a DC gain of the front-stage output signal to compensate a DC gain drop between the front-stage output signal and the digital input signal to generate a back-stage output signal to an image signal receiving apparatus (RX);
   wherein a DC gain of each of the front-stage driving circuit and the back-stage driving circuit cancels out each other when a multiplication result of a transconductance and a resistance of a load resistor of each of the front-stage driving circuit and the back-stage driving circuit is far larger than 1.

2. The signal output circuit of claim 1, wherein each of the digital input signal, the front-stage output signal and the back-stage output signal is a differential signal.

3. The signal output circuit of claim 1, wherein the front-stage driving circuit receives the front-stage output signal from a digital signal processing circuit comprised in the image signal transmission apparatus.

4. The signal output circuit of claim 1, wherein the front-stage driving circuit comprises:
   two input transistors each comprising:
   a gate configured to receive the digital input signal;
   a drain electrically coupled to an output terminal and configured to generate the front-stage output signal to the output terminal; and
   a source;
   two load resistors each electrically coupled between the drain of one of the two input transistors and an operation voltage source;
   two load capacitors each electrically coupled to the drain of one of the two input transistors and a ground terminal;

an adjusting resistor and the adjusting capacitor electrically coupled in parallel between the sources of the two input transistors; and two current sources each electrically coupled between the source of one of the two input transistors and the ground terminal.

5. The signal output circuit of claim 4, wherein a zero and two poles of a frequency response of the front-stage driving circuit are determined by a plurality of circuit parameters of the front-stage driving circuit, the circuit parameters comprise a resistance Rd of each of the two load resistors, a capacitance Cd of each of the two load capacitors, a resistance 2Rs of the adjusting resistor, and a capacitance Cs of the adjusting capacitor;

wherein a transconductance of the two input transistors is gm, the zero is 1/(RsCs), the two poles are respectively (1+gmRs)/(RsCs) and 1/(RdCd), a transfer function between the digital input signal and the front-stage output signal is (gmRd)(1+sRsCs)/(1+sRcCs+gmRs)(1+sRdCd)), and a direct current (DC) gain of the front-stage driving circuit is (gmRd)/(1+(gmRs)).

6. The signal output circuit of claim 1, wherein the back-stage driving circuit comprises:

two input transistors each comprising:

a gate configured to receive the front-stage output signal;

a drain electrically coupled to an output terminal and configured to generate the back-stage output signal to the output terminal; and a source;

two load resistors each electrically coupled between the drain of one of the two input transistors and an operation voltage source;

two load capacitors each electrically coupled to the drain of one of the two input transistors and a ground terminal;

an adjusting resistor electrically coupled between the sources of the two input transistors; and two current sources each electrically coupled between the source of one of the two input transistors and the ground terminal.

7. The signal output circuit of claim 6, wherein a zero and two poles of a frequency response of the back-stage driving circuit are determined by a plurality of circuit parameters of the back-stage driving circuit, the circuit parameters comprise a resistance Rs of each of the two load resistors, a capacitance Cd of each of the two load capacitors and a resistance 2Rd of the adjusting resistor;

wherein a transconductance of the two input transistors is gm, the zero is 1/(RsCd), a transfer function between the front-stage output signal and the back-stage output signal is (gmRs)/(1+gmRd)(1+sRsCd), and a DC gain of the back-stage driving circuit is (gmRs)/(1+(gmRd)).

8. An image signal transmission apparatus used in an image signal transmission system, comprising:

a digital signal processing circuit configured to generate a digital input signal; and a signal output circuit comprising:

a front-stage driving circuit comprising a first CTLE having an adjusting capacitor and configured to receive the digital input signal to perform a high frequency enhancement thereon to increase a bandwidth of the digital input signal to generate a front-stage output signal; and a back-stage driving circuit comprising a second CTLE without the adjusting capacitor and configured to increase a DC gain of the front-stage output signal to compensate a DC gain drop between the front-stage output signal and the digital input signal to generate a back-stage output signal to an image signal receiving apparatus;

wherein a DC gain of each of the front-stage driving circuit and the back-stage driving circuit cancels out each other when a multiplication result of a transconductance and a resistance of a load resistor of each of the front-stage driving circuit and the back-stage driving circuit is far larger than 1.

9. The image signal transmission apparatus of claim 8, wherein each of the digital input signal, the front-stage output signal and the back-stage output signal is a differential signal.

10. The image signal transmission apparatus of claim 8, wherein the front-stage driving circuit receives the front-stage output signal from a digital signal processing circuit comprised in the image signal transmission apparatus.

11. The image signal transmission apparatus of claim 8, wherein the front-stage driving circuit comprises:

two input transistors each comprising:

a gate configured to receive the digital input signal;

a drain electrically coupled to an output terminal and configured to generate the front-stage output signal to the output terminal; and a source;

two load resistors each electrically coupled between the drain of one of the two input transistors and an operation voltage source;

two load capacitors each electrically coupled to the drain of one of the two input transistors and a ground terminal;

an adjusting resistor and the adjusting capacitor electrically coupled in parallel between the sources of the two input transistors; and two current sources each electrically coupled between the source of one of the two input transistors and the ground terminal.

12. The image signal transmission apparatus of claim 11, wherein a zero and two poles of a frequency response of the front-stage driving circuit are determined by a plurality of circuit parameters of the front-stage driving circuit, the circuit parameters comprise a resistance Rd of each of the two load resistors, a capacitance Cd of each of the two load capacitors, a resistance 2Rs of the adjusting resistor, and a capacitance Cs of the adjusting capacitor;

wherein a transconductance of the two input transistors is gm, the zero is 1/(RsCs), the two poles are respectively (1+gmRs)/(RsCs) and 1/(RdCd), a transfer function between the digital input signal and the front-stage output signal is (gmRd)(1+sRsCs)/(1+sRcCs+gmRs)(1+sRdCd)), and a direct current (DC) gain of the front-stage driving circuit is (gmRd)/(1+(gmRs)).

13. The image signal transmission apparatus of claim 8, wherein the back-stage driving circuit comprises:

two input transistors each comprising:

a gate configured to receive the front-stage output signal;

a drain electrically coupled to an output terminal and configured to generate the back-stage output signal to the output terminal; and a source;

two load resistors each electrically coupled between the drain of one of the two input transistors and an operation voltage source;

two load capacitors each electrically coupled to the drain of one of the two input transistors and a ground terminal;

an adjusting resistor electrically coupled between the sources of the two input transistors; and two current sources each electrically coupled between the source of one of the two input transistors and the ground terminal.

14. The image signal transmission apparatus of claim 13, wherein a zero and two poles of a frequency response of the back-stage driving circuit are determined by a plurality of circuit parameters of the back-stage driving circuit, the circuit parameters comprise a resistance Rs of each of the two load resistors, a capacitance Cd of each of the two load capacitors and a resistance 2Rd of the adjusting resistor;

wherein a transconductance of the two input transistors is gm, the zero is $1/(R_sC_d)$, a transfer function between the front-stage output signal and the back-stage output signal is $(gmR_s)/(1+gmR_d)(1+sR_sC_d)$, and a DC gain of the back-stage driving circuit is $(gmR_s)/(1+(gmR_d))$.

* * * * *